(12) United States Patent
Lundberg

(10) Patent No.: US 6,420,924 B1
(45) Date of Patent: Jul. 16, 2002

(54) SLEW-CONTROLLED SPLIT-VOLTAGE OUTPUT DRIVER

(75) Inventor: James R. Lundberg, Austin, TX (US)

(73) Assignee: IP-First L.L.C., Fremont, CA (US)

( * ) Notice: Subject to any disclaimer, the term of this patent is extended or adjusted under 35 U.S.C. 154(b) by 0 days.

(21) Appl. No.: 09/150,316

(22) Filed: Sep. 9, 1998

(51) Int. Cl.[7] .............................................. H03L 5/00
(52) U.S. Cl. ..................... 327/333; 327/112; 327/170
(58) Field of Search ................................ 327/170, 333, 327/112; 326/63, 62, 80, 81

(56) References Cited

U.S. PATENT DOCUMENTS

| | | | | |
|---|---|---|---|---|
| 5,321,319 A | * | 6/1994 | Mahmood | 326/57 |
| 5,381,116 A | | 1/1995 | Nuckolls et al. | 331/1 |
| 5,389,834 A | * | 2/1995 | Kinugasa et al. | 327/333 |
| 5,396,128 A | | 3/1995 | Dunning et al. | 326/68 |
| 5,420,543 A | | 5/1995 | Lundberg et al. | 331/1 |
| 5,506,875 A | | 4/1996 | Nuckolls et al. | 375/375 |
| 5,511,100 A | | 4/1996 | Lundberg et al. | 375/376 |
| 5,513,358 A | | 4/1996 | Lundberg et al. | 395/750 |
| 5,828,260 A | * | 10/1998 | Taniguchi et al. | 327/333 |
| 5,969,554 A | * | 10/1999 | Chan et al. | 327/170 |
| 6,069,509 A | * | 5/2000 | Labram | 327/170 |
| 6,255,867 B1 | * | 7/2001 | Chen | 327/170 |
| 6,262,599 B1 | * | 7/2001 | Coughlin, Jr. et al. | 326/81 |
| 6,262,617 B1 | * | 7/2001 | McClure | 327/170 |
| 6,271,699 B1 | * | 8/2001 | Dowlatabadi | 327/170 |

* cited by examiner

Primary Examiner—Terry D. Cunningham
Assistant Examiner—Quanl Tra
(74) Attorney, Agent, or Firm—Richard K. Huffman; James W. Huffman

(57) ABSTRACT

A CMOS slew-controlled split-voltage output driver is provided whose I/O logic is supplied at one (higher) voltage level and whose computational logic is supplied at a second (lower) voltage level. The slew-controlled split-voltage output driver includes an output driver circuit, a driver control circuit, and a feedback-enhanced level translator circuit. The output driver circuit drives the output signal to a low level, a high level, or a tri-state level. The driver control circuit receives an enable signal, and employs the enable signal to control turn on and turn off of the N-channel sink transistor. The feedback-enhanced level translator circuit receives an output state signal whose highlevel state is essentially equal to a second power supply voltage. The feedback-enhanced level translator circuit generates the enable signal to the level essentially equal to the first power supply voltage, and isolates generation of the enable signal from operation of the driver control circuit.

14 Claims, 6 Drawing Sheets

Slew-Controlled Split Voltage Output Driver

Conventional Split-Voltage Output Driver

Slew-Controlled Split Voltage Output Driver

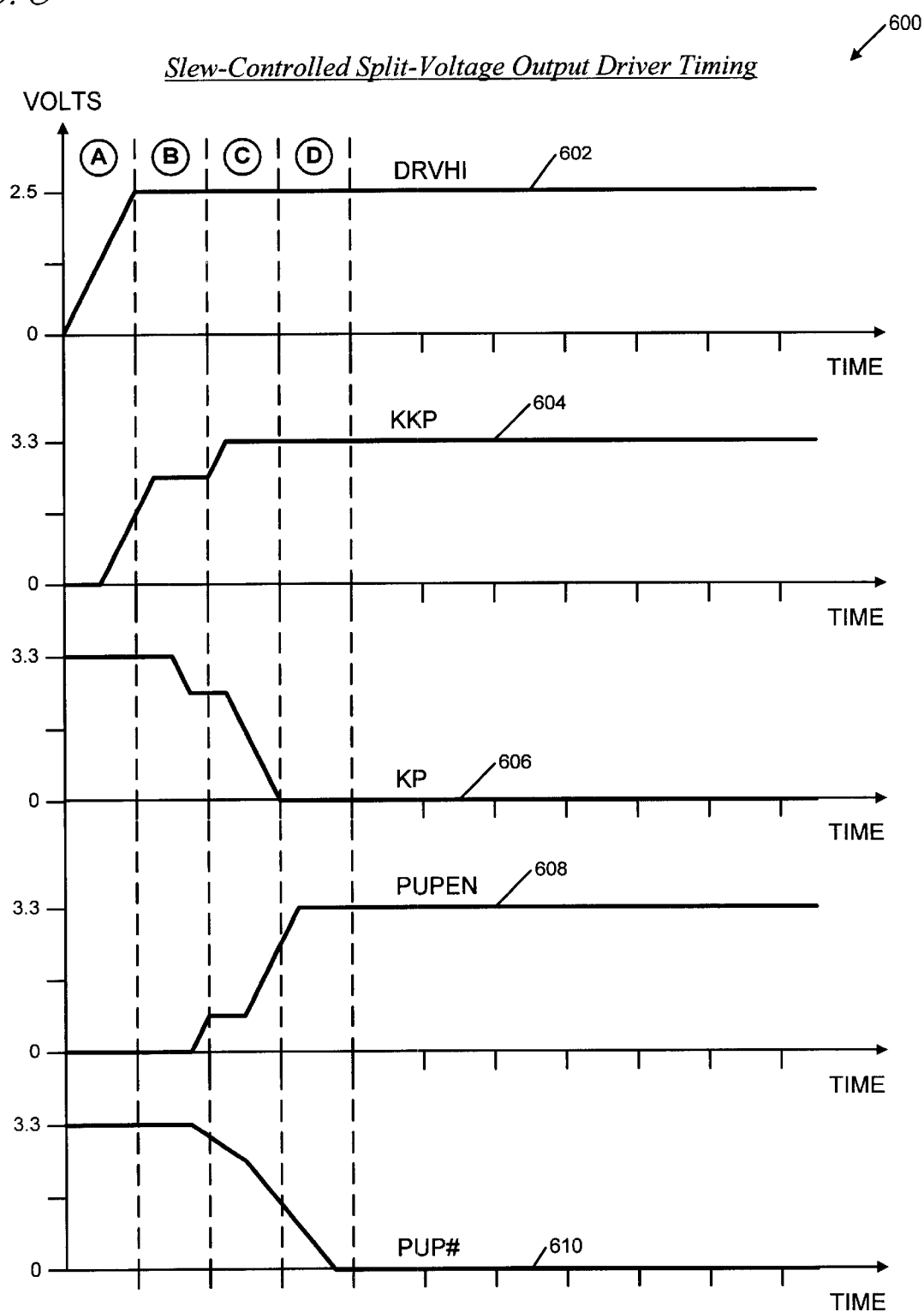

SLEW-CONTROLLED SPLIT-VOLTAGE OUTPUT DRIVER

BACKGROUND OF THE INVENTION

1. Field of the Invention

This invention relates in general to the field of output drivers in semiconductor integrated circuit devices, and more particularly to a CMOS device in a microprocessor for driving an output at one power supply voltage based upon signals from a lower power supply voltage.

2. Description of the Related Art

Conventional microprocessors and their related interface logic devices communicate digitally-coded information over physical connections that must adhere to a standard set of physical and electrical specifications. Those skilled in the art appreciate that these physical and electrical specifications are most often correlated to the particular technology used to fabricate the connected devices. An example device specification is 5-volt complimentary metal-oxide semiconductor (CMOS) logic. 5 -volt CMOS devices can be connected together and reliably communicate because their inputs and outputs are at compatible voltage levels.

Advances in integrated circuit fabrication technologies have resulted, though, in the ability to shrink the size of the basic transistor elements that make up an integrated circuit. Consequently, integrated circuit devices are now commonly produced comprising millions of transistors on a single chip. The development of microprocessors has played a prominent role in the scaling of integrated circuit fabrication technologies.

Along with the ability to densely integrate millions of transistors on a single chip, circuit designers have also found that significant improvements in device operating speed and reliability can be realized by operating devices at lower voltage levels. For example, the operating voltage for CMOS devices has migrated from 5 volts to a present standard of 3.3 volts.

Innovations in fabrication technologies continue to permit device designers to populate a chip with more and more transistors. In addition, related enabling technologies make it possible and beneficial to step down the operating voltage for sub-micron CMOS devices. CMOS microprocessors are now being developed that operate at voltages below three volts. Although the core computational logic of these microprocessors is referenced to a lower level voltage, the input/output (I/O) elements of the microprocessors must still provide signals to existing technology peripheral devices. Hence, the I/O elements of these microprocessors generate signals that are referenced to voltage levels compatible with the existing devices.

One of the means to increase device integration while also providing compatibility with existing devices is to provide a microprocessor that operates at two voltage levels. A first (higher) voltage level powers all of the I/O logic on the microprocessor so that it provides compatible I/O signals. A second (lower) voltage level is used to power all of the core computational logic. While this approach solves the external device interface problem, it also presents a similar interface problem internal to the microprocessor: computational logic outputs must be made compatible with I/O logic. That is, an output of the computational logic referenced to the second (lower) voltage level must be translated to the first (higher) voltage level to reliably control the I/O logic.

A split-voltage output driver is commonly used to translate a control signal to a higher voltage level so that it can drive I/O circuitry. The split-voltage output driver uses simple feedback means to perform the voltage translation. The split-voltage output driver is acceptable when used in a dual-voltage microprocessor that runs at slower speeds.

However, a noise problem arises when a scaled microprocessor is operated at higher speeds. Bonding means within the circuit package and power supplies to which the microprocessor is connected both exhibit fixed inductances. Consequently, transitioning device outputs at a faster rate proportionally increases voltage noise levels. Because of this, microprocessor designers provide means to control the transition rate of a microprocessor's outputs. By controlling the rate at which a microprocessor output changes state, the noise problem is addressed.

Conventional split-voltage output drivers either degrade in operation or fail completely when employed in a microprocessor that provides slew-rate control of its outputs.

In view of the above problem discussion, what is needed is an output driver that receives a control signal referenced to a lower power supply voltage and produces an output referenced to a higher power supply voltage, in the presence of slew-control. In addition, what is needed is a slew-controlled split-voltage output driver that reliably performs voltage level translation.

SUMMARY OF THE INVENTION

Accordingly, in the attainment of the aforementioned object, it is a feature of the present invention to provide a slew-controlled split-voltage output driver in a microprocessor, for providing an output signal referenced to a first power supply voltage. The slew-controlled split-voltage output driver includes an output driver circuit, a driver control circuit, and a feedback-enhanced level translator circuit. The output driver circuit drives the output signal to a low level, a high level, or a tri-state level. The output driver circuit has a P-channel source transistor, coupled to the first power supply voltage, and an N-channel sink transistor, connected in series with the P-channel source transistor across the first power supply voltage. The output signal is formed by the connection between drain nodes of the P-channel source and the N-channel sink transistors. The P-channel source transistor pulls the output signal up to the first power supply voltage, thereby referencing the output signal to the first power supply voltage. The driver control circuit is coupled to the first power supply voltage. The driver control circuit receives an enable signal, and employs the enable signal to control turn on and turn off of the N-channel sink transistor, where, to control turn on and turn off, the enable signal must switch to a level essentially equal to the first power supply voltage. The driver control circuit has a first N-channel transistor and slew control logic. The first N-channel transistor is driven by the enable signal, and controls turn off of the N-channel sink transistor. The slew control logic is coupled to the first N-channel transistor. The slew control logic is driven by the enable signal, and senses direction of the enable signal, and turns on slowly and turns off quickly, thereby controlling turn on of the N-channel sink transistor. The feedback-enhanced level translator circuit is coupled to the driver control circuit. The feedback-enhanced level translator circuit receives an output state signal whose high-level state is essentially equal to a second power supply voltage, where the second power supply voltage is at least one half of the first power supply voltage, and where the feedback-enhanced level translator circuit generates the enable signal to the level essentially equal to the first power supply voltage, and where the feedback-enhanced level translator circuit isolates generation of the enable signal from operation of the driver control circuit. The enable signal is directly driven by the output state signal through a second N-channel transistor, where the output state signal is applied to a source node of the second N-channel transistor.

An advantage of the present invention is that a microprocessor employing the present invention can operate reliably at higher operating speeds than has heretofore been achieved.

Another object of the invention is to provide a slew-controlled split-voltage output driver that reliably performs voltage level translation.

In another aspect, it is a feature of the present invention to provide a slew-controlled split-voltage output driver in a microprocessor, for providing an output signal referenced to a first power supply voltage. The slew-controlled split-voltage output driver includes an output driver circuit, a driver control circuit, and a feedback-enhanced level translator circuit. The output driver circuit drives the output signal to a low level, a high level, or a tri-state level. The output signal is pulled up to the first power supply voltage through a P-channel source transistor, thereby referencing the output signal to the first power supply voltage. The driver control circuit is coupled to the output driver circuit and to the first power supply voltage. The driver control circuit receives an enable signal, and employs the enable signal to control turn on and turn off the P-channel source transistor, where, to control turn on and turn off, the enable signal must switch to a level essentially equal to the first power supply voltage. The driver control circuit has a first P-channel transistor and a slew control circuit. The first P-channel transistor is driven by the enable signal, and controls turn off of the P-channel source transistor. The slew control circuit is coupled to the first P-channel transistor, and is driven by the enable signal, and senses direction of the enable signal, and turns on slowly and turns off quickly, thereby controlling turn on of the P-channel source transistor. The feedback-enhanced level translator circuit is coupled to the driver control circuit. The feedback-enhanced level translator circuit receives an output state signal whose high-level state is essentially equal to a second power supply voltage. The second power supply voltage is at least one half of the first power supply voltage. The feedback-enhanced level translator circuit generates the enable signal to the level essentially equal to the first power supply voltage, and the feedback-enhanced level translator circuit isolates generation of the enable signal from operation of the driver control circuit. The enable signal is directly driven by the output state signal through an N-channel transistor, where the output state signal is applied to a source node of the N-channel transistor.

In yet another aspect, it is a feature of the present invention to provide a slew-controlled split-voltage output driver in a microprocessor, for providing an output signal having a high-level essentially equal to a first power supply voltage. The slew-controlled split-voltage output driver includes an output driver circuit, a source driver control circuit, a sink driver control circuit, a first feedback-enhanced level translator circuit, and a second feedback-enhanced level translator circuit. The output driver circuit drives the output signal to a low level, the high level, or a tri-state level. The output driver circuit has a source transistor that is coupled to the first power supply voltage, and a sink transistor, connected in series with the source transistor across the first power supply voltage. The source driver control circuit is coupled to the source transistor of the output driver circuit. The source driver control circuit receives a source enable signal, and slowly turns on and quickly turns off the source transistor; wherein the source enable signal switches to a level essentially equal to the first power supply voltage. The sink driver control circuit is coupled to the sink transistor of the output driver circuit. The sink driver control circuit receives a sink enable signal, and slowly turns on and quickly turns off the sink transistor, where the sink enable signal switches to the level essentially equal to the first power supply voltage. The first feedback-enhanced level translator circuit is coupled to the source driver control circuit. The first feedback-enhanced level translator circuit receives a source output state signal having a high-level state essentially equal to a second power supply voltage, where the first feedback-enhanced level translator circuit generates source enable signal to the level essentially equal to the first power supply voltage, and where the first feedback-enhanced level translator circuit isolates generation of the source enable signal from operation of the source driver control circuit. The source enable signal is directly driven by the source output state signal through a first N-channel transistor, where the source output state signal is applied to a first source node of the first N-channel transistor. The second feedback-enhanced level translator circuit is coupled to the sink driver control circuit. The second feedback-enhanced level translator circuit receives a sink output state signal having a high-level state essentially equal to the second power supply voltage, where the second feedback-enhanced level translator circuit generates the sink enable signal to the level essentially equal to the first power supply voltage, and where the second feedback-enhanced level translator circuit isolates generation of the sink enable signal from operation of the sink driver control circuit. The second power supply voltage is at least one half of the first power supply voltage. The sink enable signal is directly driven by the sink output state signal through a second N-channel transistor, where the sink output state signal is applied to a second source node of the second N-channel transistor.

Another advantage of the present invention is that a lower voltage control signal progresses to produce a higher level output signal whose rate of transition is controlled to minimize voltage noise.

BRIEF DESCRIPTION OF THE DRAWINGS

These and other objects, features, and advantages of the present invention will become better understood with regard to the following description, and accompanying drawings where:

FIG. 6 is a timing diagram illustrating signal states for the slew-controlled split-voltage output driver of FIG. 5.

DETAILED DESCRIPTION

In light of the above background on techniques for interfacing a scaled-technology microprocessor to existing devices having a higher supply voltage, several related art examples will now be discussed with reference to FIGS. 1 through 4. These examples illustrate operational problems associated with present day split-voltage output drivers when employed in a microprocessor requiring controlled output slew rates. Following this discussion, a detailed description of the present invention will be provided with reference to FIGS. 5 and 6. Use of the present invention provides for voltage translation of a lower level computational signal to a higher level output signal which has slew-controlled transitions.

Figure 1:
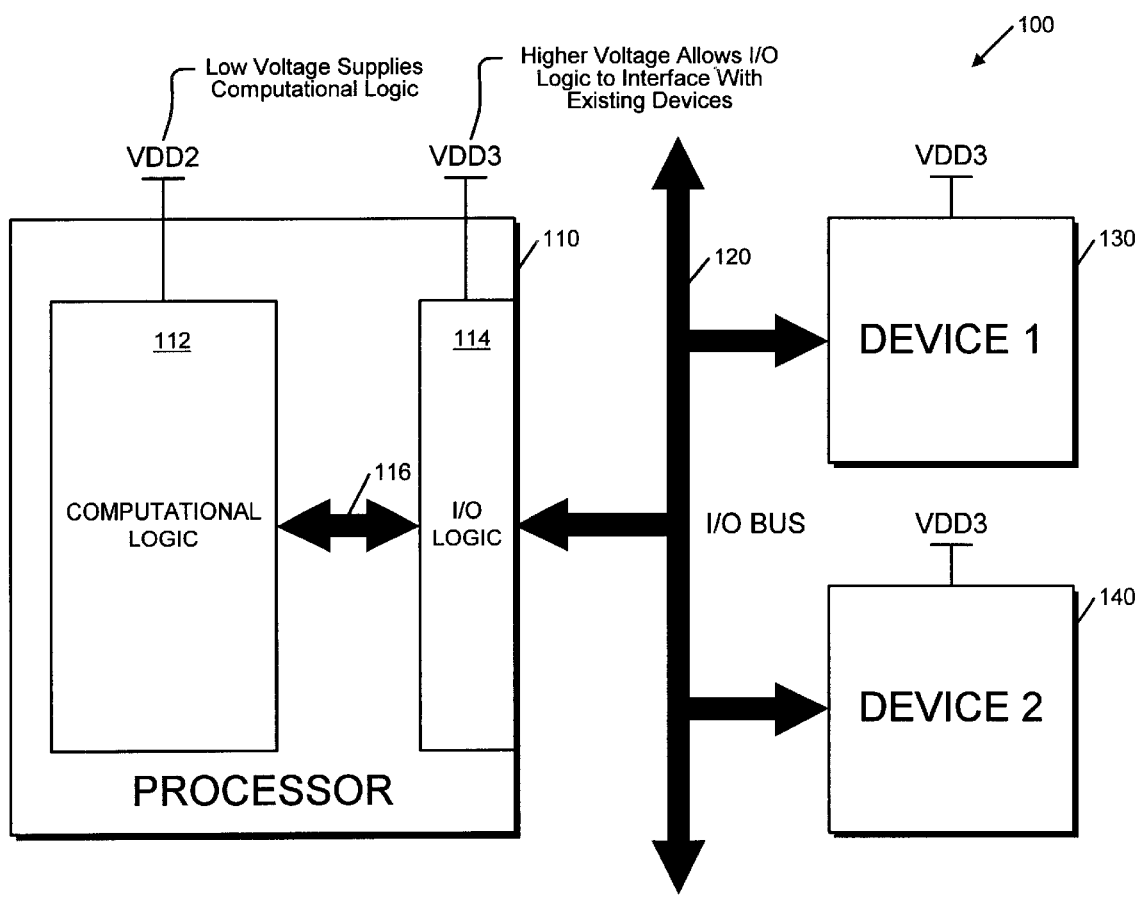
FIG. 1 is a block diagram of a related art dual-voltage processing system.

Referring to FIG. 1, a block diagram of a related art processing system 100 is presented. The processing system 100 includes a processor 110 connected to two peripheral devices 130, 140 via an I/O bus 120. The peripheral devices 130, 140 may be main memory, bus interface logic, or any of a number of other device types typically found in present day processing systems.

Operationally, as program instructions are executed by the processor 110, it receives inputs from, or provides outputs to, the devices 130, 140 over the I/O bus 120. The inputs and outputs consist of one or more digitally-coded signals. The digitally-coded signals are sequenced in time over the I/O bus 120. As discussed above, electrical and physical characteristics of the signals adhere to an industry standard or to a set of device specifications, thus allowing the devices 130, 140 to interoperate with the processor 110. In addition to 5-volt CMOS, other exemplary industry standards and device specifications that prescribe characteristics for interface include 5-volt transistor-transistor logic (TTL) and 3.3-volt CMOS logic. Like 5-volt CMOS, fabrication technologies for 5-volt TTL and 3.3-volt CMOS logic also drive their respective interface characteristics.

For many years, 5-volt CMOS prevailed as the principal interface standard for microprocessors and their related peripheral devices. In more recent years, innovations in integrated circuit fabrication technologies have allowed the scaling of integrated circuits to smaller and smaller dimensions. This scaling permits larger numbers of transistors to be fabricated on a single chip. For reasons advantageous to device performance and device reliability, those skilled in the art have found it desirable to operate scaled devices at lower voltages.

A notable migration in the industry to a lower operating voltage is seen in the class of 3.3-volt CMOS devices. Initially, many 3.3-volt CMOS devices retained interface compatibility with 5-volt CMOS devices still on the market. Over time, however, market acceptance of 3.3-volt CMOS technology has resulted in the existence of a comprehensive assemblage of 3.3-volt CMOS logic devices. Because of this, 3.3-volt CMOS technology has now become a de facto industry standard fabrication technology for microprocessors and related devices.

Ongoing innovations in device scaling technologies, nevertheless, continue to compel device developers to address the issue of interface compatibility with older technology devices. FIG. 1 illustrates this interface issue in detail. DEVICE 1 130 and DEVICE 2 140 are both referenced to a power supply voltage, VDD3. The processor 110 is an innovative device to the extent that its computational logic 112 has been scaled. Because speed and reliability benefits result from operating scaled logic at lower voltages, the computational logic 112 is referenced to a lower power supply voltage, VDD2. The specific magnitudes of the power supply voltages are not particularly relevant to this discussion except to note that 1) VDD2 is less than VDD3, and; 2) signals produced by the computational logic 112 cause problems when they are interfaced with other devices 130, 140 via the I/O bus 120. For instance, if the value of VDD3 is 5 volts and the value of VDD2 is 3.3 volts, then the processing system 100 of FIG. 1 would explicitly portray a problem of interfacing 3.3-volt CMOS technology to existing 5-volt CMOS devices.

Since signals produced by the computational logic 112 cannot directly interface to peripheral devices 130, 140 via the I/O bus 120, integrated circuit designers typically provide compensation within I/O logic 114. In the processor 110 of FIG. 1, compensation for the mismatch between VDD2 and VDD3 is obtained by referencing the I/O logic 114 to VDD3. Therefore, signals appearing on the I/O bus 120 are correctly referenced to VDD3.

Because the I/O signals of the processor 110 are referenced to VDD3, the interface between the computational logic 112 and the I/O logic 114 must also be addressed. The computational logic 112 communicates signals to the I/O logic 114 over an internal bus 116, however, signals from the computational logic 112 are referenced to the lower power supply level, VDD2. Since the logic levels of the signals on the internal bus 116 are referenced to VDD2, compensation circuits within the I/O logic 114 are therefore necessary to translate the signals to a voltage that is referenced to VDD3. Such mismatch compensation devices are generally designed into the I/O logic 114 to balance a number of device specifications, those most notable specifications in a conventional processor 110 being speed, power, and cost. Operation of an output driver in a microprocessor 100 is more fully developed below with reference to FIG. 2.

Figure 2:
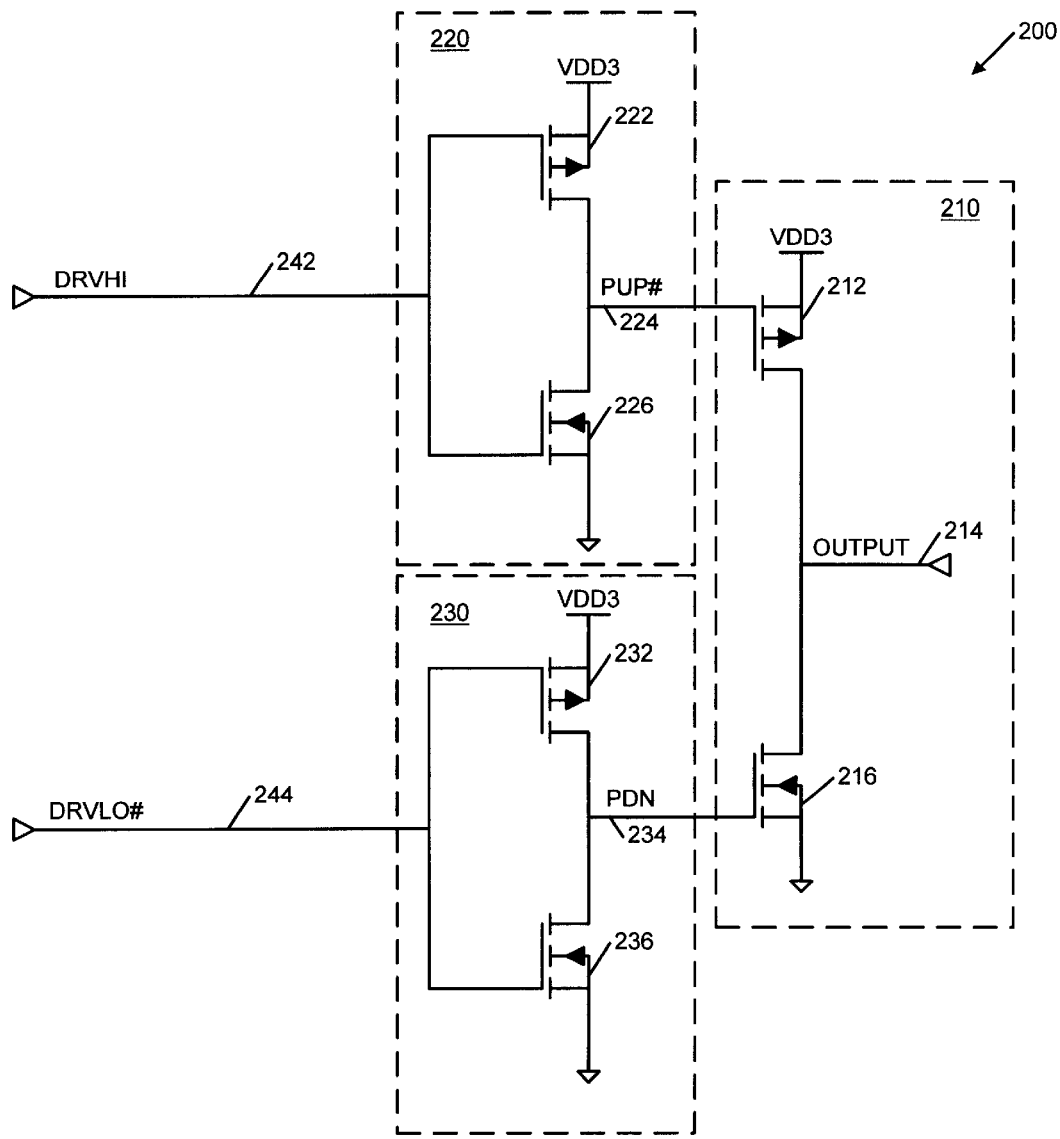
FIG. 2 is a schematic diagram of a related art single-voltage output driver.

FIG. 2 is a schematic of a related art single-voltage output driver 200. The single-voltage output driver 200 is used in microprocessors referenced to a single power supply voltage. The single-voltage output driver 200 includes an output driver circuit 210, which is controlled by two driver control circuits 220, 230. The output driver circuit 210 has an N-channel sink transistor 216 connected in series with a P-channel source transistor 212 across a power supply voltage, VDD3. An output signal 214 is formed by the connection of the drains of the P-channel source transistor 212 and the N-channel sink transistor 216.

Operationally, the P-channel source transistor 212 and the N-channel sink transistor are independently controlled to drive the output 214 to a low level, a high level, or a tri-state level. The low level is achieved by turning ON the N-channel sink transistor 216 and turning OFF the P-channel source transistor 212. The high level is achieved by turning OFF the N-channel sink transistor 216 and turning ON the P-channel source transistor 212. By turning ON the P-channel source transistor 212, the output driver circuit 210 thus drives the output 214 to a high level state that is referenced to VDD3. For instance, to interface to standard 3.3-volt CMOS logic, the magnitude of VDD3 would be 3.3 volts.

Independent control of the N-channel sink transistor 216 and the P-channel source transistor 212 is required to realize the tri-state level. The output is driven to the tri-state level by turning OFF both of the transistors 212, 216. In addition, to preclude damage to or excessive power dissipation by the output driver 200, the transistors 212, 216 should never be ON at the same time for any extended period.

A source driver control circuit 220 controls the gate of the P-channel source transistor 212 via a source control signal 224, PUP#. The driver control circuit 220 has a source transistor 222 and a sink transistor 226 that are connected in series across the power supply voltage, VDD3. A source output state signal 242, DRVHI, is connected to the gate of the source transistor 222 and the gate of the sink transistor 226. A high level referenced to VDD3 on DRVHI 242 thus turns OFF the source transistor 222 and turns ON the sink transistor 226. This causes the source control signal 224, PUP#, to be at a low level. A low level on PUP# 224 causes the P-channel source transistor 212 to turn ON. A low level on DRVHI 242 turns ON the source transistor 222 and turns OFF the sink transistor 226. This causes the source control signal 224, PUP#, to be at a high level referenced to VDD3. A high level on PUP# 224 causes the P-channel source transistor 212 to turn OFF.

Likewise, a sink driver control circuit 230 controls the gate of the N-channel source transistor 216 via a sink control signal 234, PDN. The driver control circuit 230 has a source transistor 232 and a sink transistor 236 that are connected in series across the power supply voltage, VDD3. A sink output state signal 244, DRVLO#, is connected to the gate of the source transistor 232 and the gate of the sink transistor 236. A high level referenced to VDD3 on DRVLO# 244 thus turns OFF the source transistor 232 and turns ON the sink transistor 236. This causes the source control signal 234, PDN, to be at a low level. A low level on PDN 234 causes the N-channel sink transistor 216 to turn OFF. A low level on DRVLO# 244 turns ON the source transistor 232 and turns OFF the sink transistor 236. This causes the sink control signal 234, PDN, to be at a high level referenced to VDD3. A high level on PDN 234 causes the N-channel source transistor 216 to turn ON.

As explained above, to drive the output 214 to a high level, both DRVHI 242 and DRVLO# 244 must be at a high level referenced to VDD3. To drive the output 214 to a low level, both DRVHI 242 and DRVLO# 244 must be at a low level. A tri-stated output 214 is achieved by driving DRVHI 242 to a low level and DRVLO# 244 to a high level, both of these signals 242, 244 being referenced to VDD3.

In a microprocessor referenced to a single power supply voltage, the single voltage output driver 200 sufficiently controls the output 214. Because computational logic and I/O logic within the microprocessor are referenced to the same power supply voltage, the output state signals 242, 244 for each of the driver control circuits 220, 230 achieve the voltages necessary to completely turn OFF the source transistors 222, 232. One skilled in the art will agree that to completely turn OFF a given P-channel or an N-channel transistor, the voltage at its gate must be approximately the same voltage that is connected to its source. In the case of FIG. 2, the voltage at the gate of P-channel transistor 222 must be essentially equal to VDD3 for it to be completely turned OFF without leakage. Likewise, the voltage at the gate of N-channel transistor 236 must be essentially equal to 0 volts for it to be completely turned OFF without leakage.

A problem arises, though, when computational logic of a microprocessor is referenced to a power supply voltage that is lower than that of its I/O logic. This is the case illustrated in FIG. 1. The computational logic 112 cannot directly control a single-voltage output driver 200 as shown in FIG. 2 because the output state signals 242, 244 presented in an output buffer of the computational logic 112 are not referenced to VDD3; instead, they are referenced to VDD2. Consequently, a high level presented on any output state signal 242, 244 does not achieve a high enough voltage to completely turn OFF a source transistor 222, 232 in a driver control circuit 220, 230. To completely turn OFF a source transistor 222, 232 in a driver control circuit 220, 230 requires that the voltage level of the output state signal 242, 244 be shifted (i.e., translated) in magnitude so that it is compatible with the higher power supply voltage, VDD3, to which the source transistors 222, 232 are referenced. Translation of an output state signal to provide compatibility with a higher power supply voltage is more completely illustrated with reference to FIG. 3.

Figure 3:
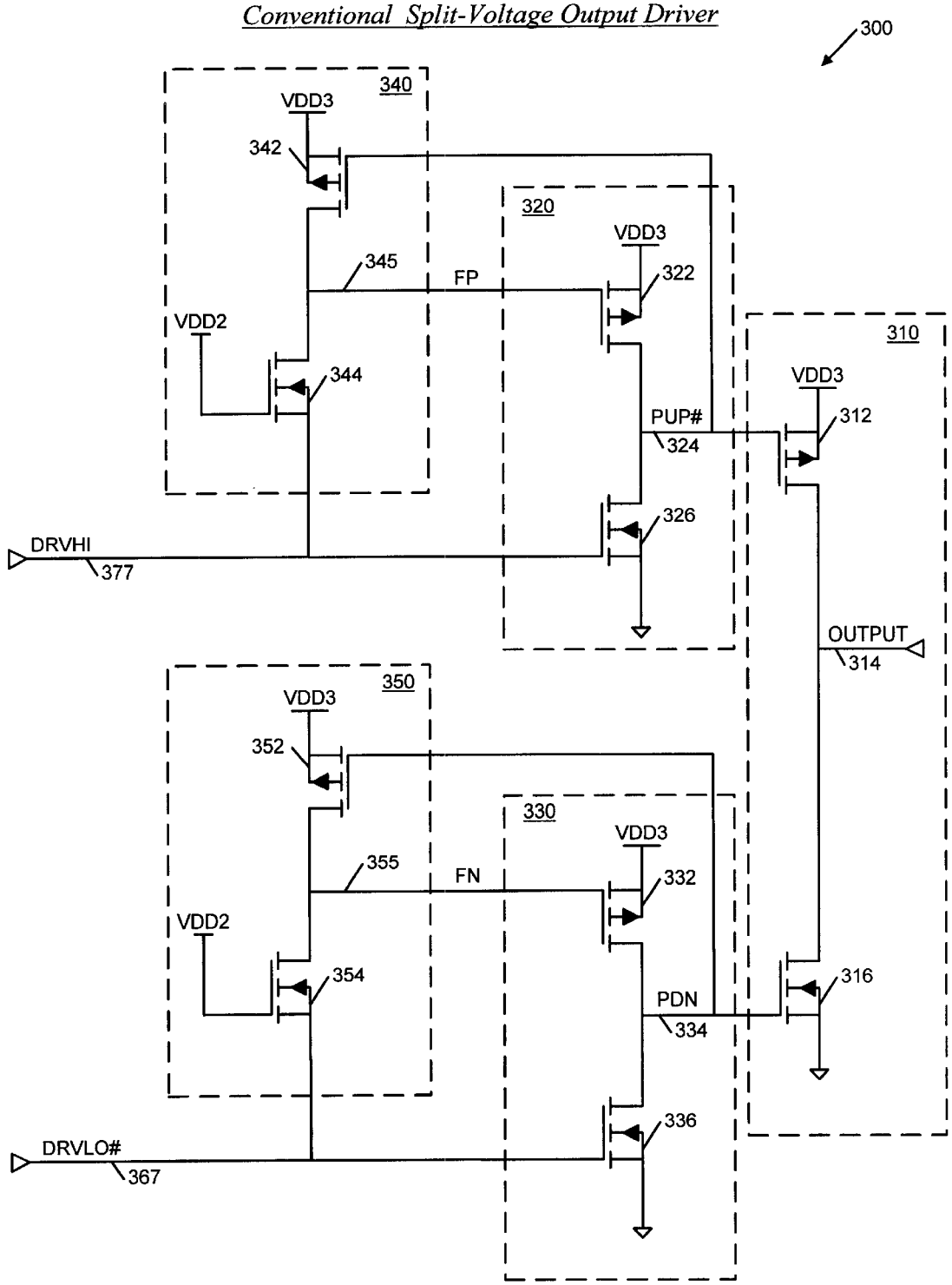
FIG. 3 is a schematic diagram of a related art split-voltage output driver.

Referring to FIG. 3, a schematic diagram of a related art split-voltage output driver 300 is provided. The split-voltage output driver 300 is typically used in microprocessors that are referenced to two different power supply voltages, like the microprocessor 100 in FIG. 1. The split-voltage output driver 300 includes an output driver circuit 310, which is controlled by two driver control circuits 320, 330. The output driver 310 and driver control circuits 320, 330 are similar to those described with reference to FIG. 2. Like elements are referenced with like numbers, the hundreds digit being replaced with a 3.

To perform the voltage translation function, the split-voltage output driver 300 includes two level shifters 340, 350: a source enable level shifter 340 is connected to a source driver control circuit 320 via a pull-up enable signal 345, FP, and a source control signal 324, PUP#. Likewise, a sink enable level shifter 350 is connected to a sink driver control circuit 330 via a pull-down enable signal 355, FN, and a sink control signal 334, PDN. The source enable level shifter 340 has a pass-through N-channel transistor 344 and a P-channel transistor 342. The drain of the pass-through N-channel transistor 344 is connected to the drain of the P-channel transistor 342.

Composition of the sink enable level shifter 350 is the same as that of the source enable level shifter 340. Like elements have like references, the tens digit being replaced by a 5.

Operation of the source enable level shifter 340 is now described. The discussion with respect to FIG. 2 noted that the problem to be addressed in a microprocessor having two power supply voltages is that the output state signal 242 (244) must essentially be equal to VDD3 to turn OFF the P-channel transistor 222 (244). Yet, in the case of a microprocessor whose computational logic is referenced to a lower power supply voltage, VDD2, this is not possible via the single-voltage output driver 200. When at a high level, DRVHI 242 is equal to VDD2, not VDD3. To address this voltage mismatch, the source enable level shifter 340 of FIG. 3 translates a source output state signal 377, DRVHI, into the pull-up enable signal 345, FP, whose voltage level is sufficient to completely turn off a source transistor 322 in the source driver control circuit 320.

When DRVHI 377 is high, i.e., essentially equal to VDD2, it will turn ON N-channel transistor 326. In addition, the gate of the pass-through N-channel transistor 344 is referenced to VDD2. Since the pass-through N-channel transistor 344 is referenced to VDD2, when DRVHI 377 initially transitions to a high level, the level of FP 345 will be essentially VDD2 minus a threshold drop across the pass-through N-channel transistor 344. In addition, the pass-through N-channel transistor 344 turns OFF. The level of FP 345, however, is not high enough to completely turn OFF the source transistor 322. As a result, for a short period of time, both the source transistor 322 and the sink transistor 326 are ON. In other words, the source transistor 322 and the sink transistor 326 are in contention. But, since the two transistors 322, 326 are roughly equivalent in drive capability, the voltage level of PUP# 324 decreases to the point where P-channel transistor 342 turns ON, thus increasing the voltage level of FP 345 to the point where the source transistor 322 turns completely OFF. As FP 345 rises above VDD2, transistor 344 remains turned OFF.

Operation of the sink enable level shifter 350 is identical to that of the source enable level shifter 340. Their differences lie in their external connections as described above.

The level shifters 340 (350) in the split-voltage output driver 300 enable a microprocessor designer to control driver control circuits 320 (330) referenced to a first power supply voltage, VDD3, with an output state S signal 377 (367) referenced to a lower power supply voltage, VDD2. But, as stated above, there is a short period of time, during transition of DRVHI 377, when both the source transistor 322 and the sink transistor 326 are in contention. A like effect is seen in transistors 332 and 336 when DRVLO# 367 changes state. Transient effects like this are routinely tolerated by microprocessor designers, particularly when feedback is employed in a design. Because the transistors 322, 326 are equivalent in size, and, since they in contention for only a short period of time, reliability issues and potential failure mode effects are limited to the extent that contention is allowed in the design.

The advantages of integrated circuit device scaling in a present day microprocessor are apparent in terms of increased device operating speed and reliability. However, increasing the operating speed, more specifically, increasing the rate at which outputs change state, causes noise problems internal and external to the microprocessor. Physical interfaces between pads on the microprocessor and wire bonds exhibit parasitic inductances. In addition, power supplies inherently possess loop inductances. Since voltage is proportional by an inductance factor to the change in current per unit time, it follows then that faster level transitions of a microprocessor output results in increased voltage noise.

Microprocessor designers compensate for such output noise by controlling the slew rate of output circuits. More specifically, in CMOS outputs such as that shown in FIG. 3, circuits are provided such that P-channel source transistor 312 turns ON slowly and turns OFF quickly. Similarly, circuits are provided such that N-channel sink transistor 316 turns ON slowly and turns OFF quickly. By controlling the slew of the output transistors 312, 316, noise effects are limited.

Various digital and analog techniques exist to control the slew of the output transistors 312, 316. For example, to turn P-channel output transistor 312 ON slowly and OFF quickly requires that the source control signal 324, PUP#, slowly transition from a high level to a low level and quickly transition from a low level to a high level. This is accomplished by turning sink transistor 326 slowly ON and quickly OFF. For the sink driver control circuit 330, equivalent slew control comprises turning source transistor 332 slowly ON and quickly OFF. By thus controlling the states of transistors 326 and 332, noise effects are limited. But, in the presence of slew control, the split-voltage output driver 300 of FIG. 3 does not exhibit stable operation. This point is more soundly presented with reference to FIG. 4.

Figure 4:
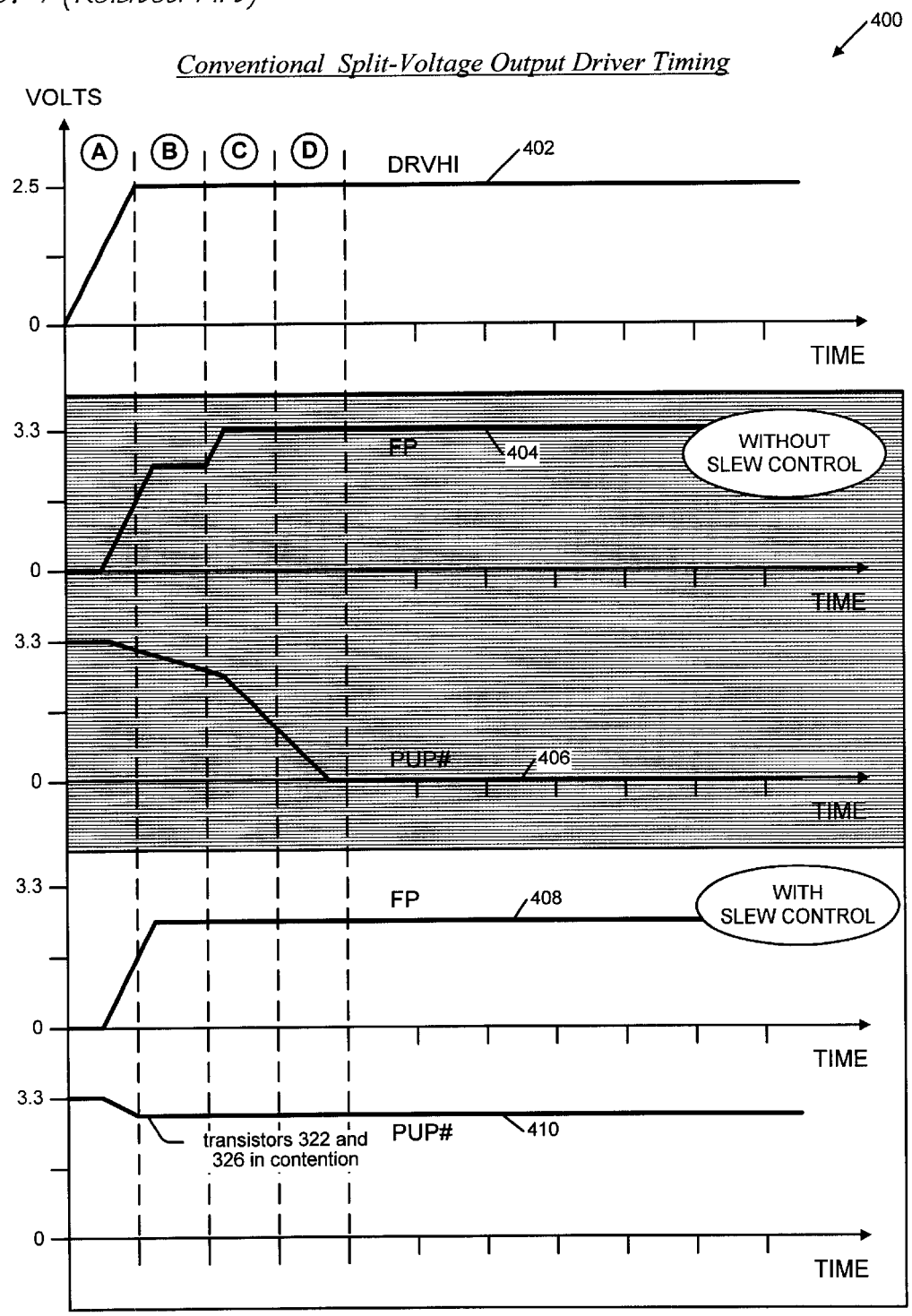
FIG. 4 is a timing diagram illustrating signal states for the split-voltage output driver of FIG. 3 in the absence of and presence of slew-rate control.

FIG. 4 is a timing diagram 400 illustrating signal states for the split-voltage output driver of FIG. 3 in both the absence of and presence of slew-rate control. Line 402 depicts transition of the source output state signal 377, DRVHI, from a low level to a high level. Line 404 is the resultant state of the pull-up enable signal 345, FP, in the absence of slew control. Line 408 is the resultant state of FP 345, in the presence of slew control. Line 406 is the resultant state of the source control signal 324, PUP#, in the absence of slew control. Line 410 is the resultant state of PUP# 324, in the presence of slew control. The voltages on the VOLTS axes are representative of 2.5-volt CMOS computational logic being employed to drive an output according to 3.3-volt CMOS logic levels. Transition of the signals is shown with respect to dashed regions of the TIME axes. Initially, operation of the split-voltage output driver 300 in the absence of slew rate control is described. Following this, the effects of adding slew control are presented.

During time region A, DRVHI 377 transitions from a low level to a high level. Accordingly, the level of FP 345 is commuted with slight delay through the pass-through N-channel transistor 344. Also during time region A, PUP# 324 begins to transition because transistor 326 turns on, is still pulled high because source transistor 322 has not yet turned OFF.

During time region B, FP 345 levels out at a threshold drop less than the level of DRVHI 377. But this is not a high enough voltage to completely turn OFF source transistor 322.

During time region C, the decreasing level of PUP# 324 causes the P-channel transistor 342 to turn ON. Turning on the P-channel transistor 342 increases the voltage of FP 345, thus beginning to turn the source transistor 322 OFF. During this time region, transistors 322 and 326 are in contention.

During time region D, the source transistor 322 turns OFF, thus allowing transistor 326 to take PUP# 324 to a low level. The transistors 322, 326 are no longer in contention. Accordingly, the P-channel source transistor 312 is turned ON.

Since the transistors 322, 326 contend only for a short period of time, operational degradation of the split-voltage output driver 300 is limited.

In contrast, lines 408 and 410 illustrate the effects of providing slew control for the sink transistor 326 of the source driver control circuit 320. Recall, for controlled slew, the sink transistor 326 must turn ON slowly. Consequently, the effects on FP 345 and PUP# 324 during time regions A and B are the same in the presence of slew control as they are in the absence of slew control. Although the level of PUP# 324 decreases slightly, it is not enough drop to turn ON transistor 342.

During time region C, however, because the drive capability of the sink transistor 326 is much less than that of the source transistor 322, the source transistor 322 continues to drive current into the circuit to maintain a high level and does not immediately decrease the voltage of PUP# 324. As a result, the P-channel transistor 342 does not turn ON. Hence, the P-channel transistor 342 cannot increase the voltage of FP 345, thus beginning to turn the source transistor 322 OFF. During this time region, transistors 322 and 326 are in contention.

During time region D, the transistors 322, 326 continue in contention. This unstable operation of the split-voltage output driver 300 continues until the point at which one of the transistors 322, 326 wins the contention. If transistor 326 wins the contention, then transistor 322 resultantly turns OFF. If transistor 322 wins the contention, then the functionality of the output driver 310 is compromised.

Whether transistor 322 or transistor 326 wins the contention depends upon the particular slew control means provided and upon the particular fabrication technology of the output driver 300. In either case, unstable operation of the split-voltage output driver 300 for more than a short period of time is exhibited in the presence of slew control. Although not described with reference to FIG. 4, the same unstable operation exists for transistors 332 and 336 in the sink driver control circuit. But, because slew of PDN 334 is affected by controlling the source transistor 332, the circuit 330 will most likely not fail, but will operate erratically.

The discussion with respect to FIG. 4 shows that use of a present day split-voltage output driver 300 precludes reduction of noise via slew control devices. Consequently, one skilled in the art will appreciate that voltage translation in the presence of slew control is highly desirable, from the standpoints of both operating speed and noise effects.

The present invention overcomes the problems cited above by providing stable voltage translation in an output circuit in the presence of slew control. Therefore, employment of the present invention in a microprocessor allows increased operating speed and decreased noise effects.

Figure 5:
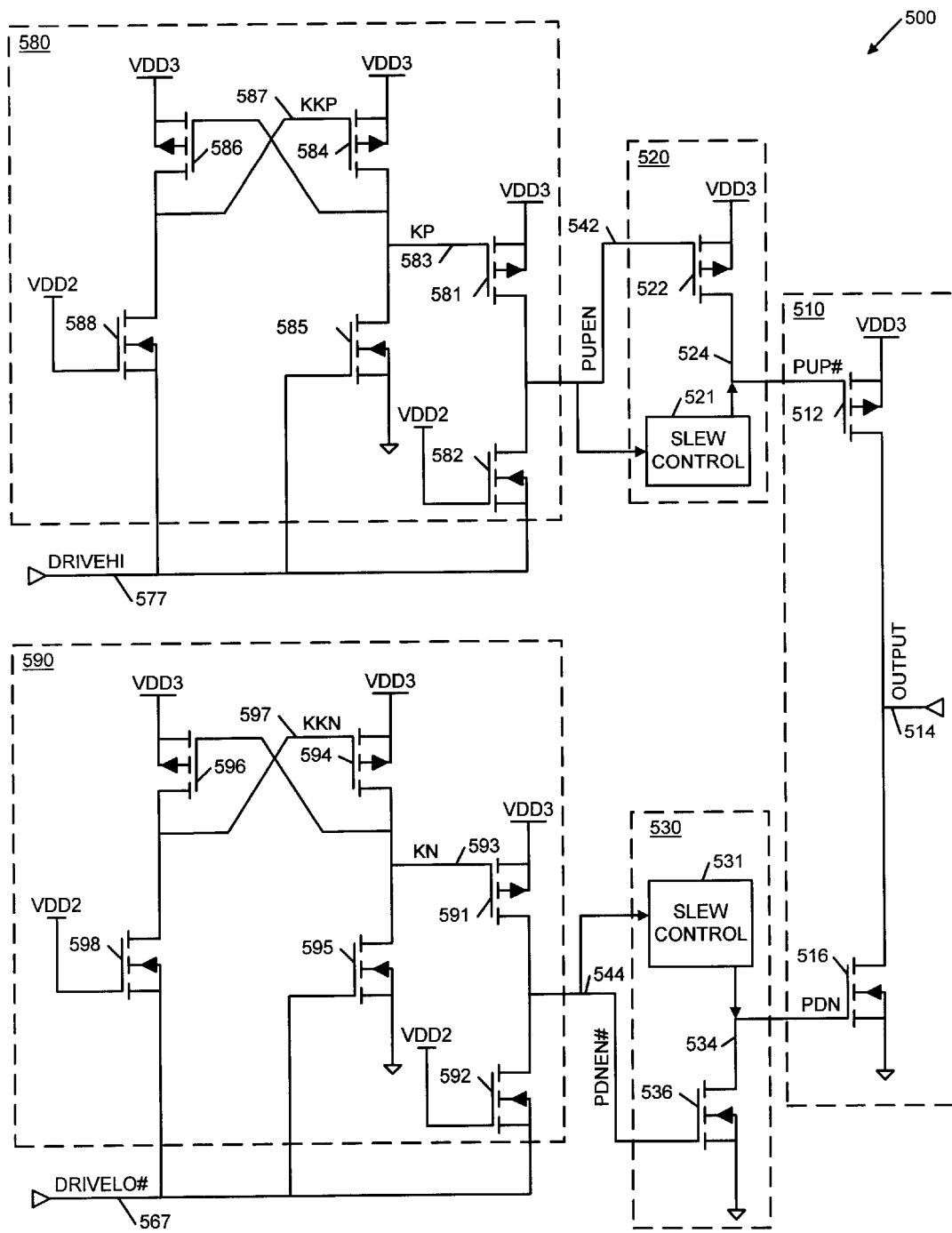
FIG. 5 is a schematic diagram of a slew-controlled split-voltage output driver according to the present invention.

Now referring to FIG. 5, a schematic diagram of a slew-controlled split-voltage output driver 500 according to the present invention is presented. The slew-controlled split-voltage output driver 500 includes an output driver circuit 510 that is controlled by two driver control circuits 520, 530. The output driver 510 and driver control circuits 520, 530 are like those described with reference to FIG. 3. Like elements are referenced with like numbers, the hundreds digit being replaced with a 5. A source driver control circuit 520 and a sink driver control circuit 530 enable independent control of a P-channel source transistor 512 and an N-channel sink transistor 516 within the output driver circuit 510 via control signals 524, 534. Thus, an output 514, formed by connection of the drain nodes of the P-channel source transistor 512 and the N-channel sink transistor 516, is capable of achieving a low level, a high level, or a tri-state level. The output 514 is referenced to a first power supply voltage, VDD3.

The driver control circuits 520, 530 explicitly depict slew control logic 521, 531 to control the turn-ON and turn-OFF of transistors 512 and 516. The slew control logic 521, 531 senses the direction of transition on signals 542 and 544, and respectively controls the slew rate of signals 524 and 534 as described above.

To perform voltage translation, the slew-controlled split-voltage output driver 500 employs two feedback-enhanced level translator circuits 580, 590. A first feedback-enhanced level translator circuit 580 receives a source output state signal 577, DRIVEHI, and performs voltage translation to provide a source enable signal 542, PUPEN, to the source driver control circuit 520. A second feedback-enhanced level translator circuit 590 receives a sink output state signal 567, DRIVELO#, and performs to provide a sink enable signal 544, PDNEN#, to the sink driver control circuit 530.

Each feedback-enhanced level translator circuit 580, 590 has identical components. For this reason, only the composition and operation of the first circuit 580 is discussed herein. The first feedback-enhanced level translator circuit 580 receives control signal 577, DRIVEHI, from a microprocessor output buffer. The control signal 577 is referenced to a second power supply voltage, VDD2, which is less than VDD3. The first feedback-enhanced level translator circuit 580 also has a first N-channel transistor 582 whose source node is directly driven by the control signal 577. The first feedback-enhanced level translator circuit 580 in addition has a P-channel transistor 581 that provides a source path referenced to VDD3. The first feedback-enhanced level translator circuit 580 moreover includes a translation circuit that is coupled to control signal 577 and the gate of the P-channel transistor 581. The translation circuit comprises transistors 584, 585, 586, 588 configured in a feedback arrangement.

Operationally, the first feedback-enhanced level translator circuit 580 receives the control signal 577, DRIVEHI, and directly applies it to the source node of the first N-channel transistor 582. The first N-channel transistor 582, because its gate is connected to VDD2, drives PUPEN 542 to the level of DRIVEHI 577 minus a threshold drop. Hence, when the control signal 577, DRIVEHI, goes low, the source enable signal 542, PUPEN, is directly driven low. In addition, driving the control signal 577 low also turns transistor 585 OFF. The gate of transistor 588 is connected to VDD2. Hence, the low level of DRIVEHI 577 is commuted across transistor 588, thus taking signal KKP 587 to a low level. This turns transistor 584 ON, which provides a solid VDD3 reference level to the P-channel transistor 581 and transistor 586, turning both of the transistors 581, 586 OFF.

When the control signal 577, DRIVEHI, goes high, the source enable signal 542, PUPEN, is directly driven to the level of VDD2. Signal 577, DRIVEHI, also turns on transistor 585. Turning transistor 585 ON causes the P-channel transistor 581 to turn ON, thus taking PUPEN 542 to a solid VDD3 reference level. Since transistor 585 is turned ON, the feedback path through transistor 586 via signal KKP 587 turns transistor 584 OFF. Therefore, the present invention allows a stable VDD3 voltage reference to be provided to transistor 522, regardless of the slew control means 521 employed. Alternative embodiments of the present invention provide slew control means 521, 531 via digital circuits, or analog circuits, or by a mix of the two techniques.

Operation of the circuits 590, 530 to control the sink transistor 516 provide the same stable voltage reference as described above for signal PDNEN# 544.

By providing stable logic voltage levels referenced to VDD3, the feedback-enhanced level translator circuits 580, 590 provide for translation of control signals 577, 567 in the presence of slew control logic 521, 531 because inputs to the driver circuits 520, 530 are isolated from the operation of the circuits 520, 530 themselves. Operation of the slew-controlled split-voltage output driver 500 according to the present invention is more completely described with respect to FIG. 6.

FIG. 6 is a timing diagram 600 illustrating signal states for the slew-controlled split-voltage output driver 500 of FIG. 5. Line 602 depicts transition of the source output state signal 577, DRIVEHI, from a low level to a high level. Line 604 depicts resultant transition of signal KKP 587. Line 606 illustrates resultant transition of signal KP 583. Line 608 illustrates resultant transition of signal PUPEN 542. Line 610 illustrates resultant transition of signal PUP# 524. The voltages on the VOLTS axes are representative of 2.5-volt CMOS computational logic being employed to drive an output according to 3.3-volt CMOS logic levels. Transition of the signals is shown with respect to dashed regions of the TIME axes.

During time region A, DRIVEHI 577 transitions from a low level to a high level. Accordingly, the level of KKP 587 is commuted with slight delay through pass-through N-channel transistor 588. Also during time region A, KP 583 and PUP# 524 remain high and PUPEN 542 remains low.

During time region B, KKP 587 levels out at a threshold drop less than the level of DRIVEHI 577. Although this is not a high enough voltage to completely turn OFF source transistor 584, transistor 585 begins to turn ON, thus decreasing the voltage on KP 583. As a result of this and of commutation of DRIVEHI 577 across transistor 582, PUPEN 542 begins to increase in voltage. Also, since KP 583 decreases in voltage, it begins to turn on transistor 586. As a result, PUP# 524 begins to decrease in level.

During time region C, transistor 586 turns ON fully and transistor 584 turns OFF completely, thus taking KKP 584 to a stable high level and KP 583 to a stable low level. As a result, PUPEN 542 increases in voltage to completely turn OFF transistor 522. Also during time region C, PUP# 512 decreases in voltage as a result of transistor 522 turning OFF. Slew control 521 controls the transition rate of PUP# 524 from high level to low level.

During time region D, transistor 581 turns completely on, thus providing a stable high level on PUPEN 542 to turn OFF transistor 522. Regardless of the controlled transition rate for PUP# 524 provided by the slew control 521, because transistor 581 is completely OFF, it does not contend with the slew control 521. Thus, the output driver 500 provides stable, slew-controlled voltage translation of DRIVEHI 577.

The discussion with respect to FIGS. 5 and 6 shows that use of the present invention allows voltage translation in the presence of slew control. Hence, a dual-voltage microprocessor may operate at higher speeds while at the same time controlling noise effects.

Although the present invention and its objects, features, and advantages have been described in detail, other embodiments are encompassed by the invention. For example, the present invention has been described with reference to an output driver in a microprocessor. However, it is entirely within the scope of this invention for the output driver to be part of any other type of digital logic device such as digital signal processor, a numeric processor, a memory, a standard cell, an ASIC, etc.

In addition, the present invention has been specifically characterized in terms of translating a control signal at lower voltage level to provide a compatible output referenced to a higher voltage level. But the present invention is also applicable to conversion of a lower level input to a device, taken from an I/O bus, into a higher level control signal that is compatible with the device itself.

Those skilled in the art will appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A slew-controlled split-voltage output driver in a microprocessor, for providing an output signal referenced to a first power supply voltage, comprising:
   an output driver circuit, for driving the output signal to a low level, a high level, or a tri-state level, said output driver circuit comprising:
   a P-channel source transistor, coupled to the first power supply voltage; and
   an N-channel sink transistor, connected in series with said P-channel source transistor across the first power supply voltage;
   wherein the output signal is formed by the connection between drain nodes of said P-channel source and said N-channel sink transistors, and wherein said P-channel source transistor pulls the output signal up to the first power supply voltage, thereby referencing the output signal to the first power supply voltage;
   a driver control circuit, coupled to the first power supply voltage, for receiving an enable signal, and configured to employ said enable signal to control turn on and turn off of said N-channel sink transistor, wherein, to control turn on and turn off, said enable signal must switch to a level essentially equal to the first power supply voltage, said driver control circuit comprising:
   a first N-channel transistor, driven by said enable signal, configured to control turn off of said N-channel sink transistor; and
   slew control logic, coupled to said first N-channel transistor, and driven by said enable signal, configured to sense direction of said enable signal, and configured to turn on slowly and turn off quickly, thereby controlling turn on of said N-channel sink transistor; and
   a feedback-enhanced level translator circuit, coupled to said driver control circuit, for receiving an output state signal whose high-level state is essentially equal to a second power supply voltage, said second power supply voltage being at least one half of the first power supply voltage, wherein said feedback-enhanced level translator circuit generates said enable signal to said level essentially equal to the first power supply voltage, and wherein said feedback-enhanced level translator circuit isolates generation of said enable signal from operation of said driver control circuit, and wherein said enable signal is directly driven by said output state signal through a second N-channel transistor, said output state signal being applied to a source node of said second N-channel transistor.

2. The slew-controlled split-voltage output driver as recited in claim 1, wherein said tri-state level is realized when both said P-channel source and N-channel sink transistors are OFF.

3. The slew-controlled split-voltage output driver as recited in claim 1, wherein the first power supply voltage is that required for interface with standard 3.3-volt CMOS logic.

4. The slew-controlled split-voltage output driver as recited in claim 1, wherein said second power supply voltage is that required for interface with standard 2.5-volt CMOS logic cells.

5. A slew-controlled split-voltage output driver in a microprocessor, for providing an output signal referenced to a first power supply voltage, comprising:
   an output driver circuit, for driving the output signal to a low level, a high level, or a tri-state level, said output signal being pulled up to the first power supply voltage through a P-channel source transistor, thereby referencing the output signal to the first power supply voltage;
   a driver control circuit, coupled to said output driver circuit and to the first power supply voltage, for receiving an enable signal, and configured to employ said enable signal to control turn on and turn off of said P-channel source transistor, wherein, to control turn on and turn off, said enable signal must switch to a level essentially equal to the first power supply voltage, said driver control circuit comprising:
   a first P-channel transistor, driven by said enable signal, configured to control turn off said P-channel source transistor; and
   a slew control circuit, coupled to said first P-channel transistor, and driven by said enable signal, configured to sense direction of said enable signal, and configured to turn on slowly and turn off quickly, thereby controlling turn on of said P-channel source transistor; and
   a feedback-enhanced level translator circuit, coupled to said driver control circuit, for receiving an output state signal whose high-level state is essentially equal to a second power supply voltage, said second power supply voltage being at least one half of the first power supply voltage, wherein said feedback-enhanced level translator circuit generates said enable signal to said level essentially equal to the first power supply voltage, and wherein said feedback-enhanced level translator circuit isolates generation of said enable signal from operation of said driver control circuit, and wherein said enable signal is directly driven by said output state signal through an N-channel transistor, said output state signal being applied to a source node of said N-channel transistor.

6. The slew-controlled split-voltage output driver, as recited in claim 5, wherein said output driver circuit comprises:

an N-channel sink transistor, connected in series with said P-channel source transistor across the first power supply voltage;

wherein the output signal is formed by the connection between drain nodes of said P-channel source and said N-channel sink transistors.

7. The slew-controlled split-voltage output driver as recited in claim 6, wherein said tri-state level is realized when both said P-channel source and N-channel sink transistors are OFF.

8. The slew-controlled split-voltage output driver as recited in claim 5, wherein the first power supply voltage is that required for interface with standard 3.3-volt CMOS logic.

9. The slew-controlled split-voltage output driver as recited in claim 5, wherein said second power supply voltage is that required for interface with standard 2.5-volt CMOS logic cells.

10. A slew-controlled split-voltage output driver in a microprocessor, for providing an output signal having a high-level essentially equal to a first power supply voltage, comprising:

an output driver circuit, for driving the output signal to a low level, the high level, or a tri-state level, said output driver circuit comprising:
 a source transistor, coupled to the first power supply voltage; and
 a sink transistor, connected in series with said source transistor across the first power supply voltage;

a source driver control circuit, coupled to said source transistor of said output driver circuit, for receiving a source enable signal, and for slowly turning on and quickly turning off said source transistor; wherein said source enable signal switches to a level essentially equal to the first power supply voltage;

a sink driver control circuit, coupled to said sink transistor of said output driver circuit, for receiving a sink enable signal, and for slowly turning on and quickly turning off said sink transistor, wherein said sink enable signal switches to said level essentially equal to the first power supply voltage;

a first feedback-enhanced level translator circuit, coupled to said source driver control circuit, for receiving a source output state signal having a highlevel state essentially equal to a second power supply voltage, wherein said first feedback-enhanced level translator circuit generates said source enable signal to said level essentially equal to the first power supply voltage, and wherein said first feedback-enhanced level translator circuit isolates generation of said source enable signal from operation of said source driver control circuit, and wherein said source enable signal is directly driven by said source output state signal through a first N-channel transistor, said source output state signal being applied to a first source node of said first N-channel transistor; and a second feedback-enhanced level translator circuit, coupled to said sink driver control circuit, for receiving a sink output state signal having a high-level state essentially equal to said second power supply voltage, wherein said second feedback-enhanced level translator circuit generates said sink enable signal to said level essentially equal to the first power supply voltage, and wherein said second feedback-enhanced level translator circuit isolates generation of said sink enable signal from operation of said sink driver control circuit, and wherein said sink enable signal is directly driven by said sink output state signal through a second N-channel transistor, said sink output state signal being applied to a second source node of said second N-channel transistor;

wherein said second power supply voltage is at least one half of the first power supply voltage.

11. The slew-controlled split-voltage output driver as recited in claim 10, wherein said the output signal is formed by connection of drains of said source transistor and said sink transistor.

12. The slew-controlled split-voltage output driver as recited in claim 10, wherein said tri-state level is realized when both said source transistor and said sink transistors are OFF.

13. The slew-controlled split-voltage output driver as recited in claim 10, wherein the first power supply voltage is that required for interface with standard 3.3-volt CMOS logic.

14. The slew-controlled split-voltage output driver as recited in claim 10, wherein said second power supply voltage is that required for interface with standard 2.5-volt CMOS logic cells.

* * * * *